United States Patent
Weichart

(10) Patent No.: US 8,852,412 B2
(45) Date of Patent: Oct. 7, 2014

(54) MAGNETRON SOURCE AND METHOD OF MANUFACTURING

(75) Inventor: Juergen Weichart, Balzers (LI)

(73) Assignee: Oerlikon Advanced Technologies AG, Balzers (LI)

( * ) Notice: Subject to any disclaimer, the term of this patent is extended or adjusted under 35 U.S.C. 154(b) by 117 days.

(21) Appl. No.: 13/022,023

(22) Filed: Feb. 7, 2011

(65) Prior Publication Data

US 2011/0192715 A1    Aug. 11, 2011

Related U.S. Application Data

(60) Provisional application No. 61/303,051, filed on Feb. 10, 2010.

(51) Int. Cl.
*C23C 14/35* (2006.01)
*H01J 37/34* (2006.01)

(52) U.S. Cl.
CPC ......... *H01J 37/3408* (2013.01); *H01J 37/3455* (2013.01)
USPC ................ 204/298.16; 204/298.2; 204/192.2; 204/192.12; 315/111.41

(58) Field of Classification Search
None
See application file for complete search history.

(56) References Cited

U.S. PATENT DOCUMENTS

| | | | |
|---|---|---|---|
| 3,303,116 A * | 2/1967 | Maissell et al. | 204/192.2 |
| 5,188,717 A | 2/1993 | Broadbent et al. | |
| 5,399,253 A * | 3/1995 | Grunenfelder | 204/298.2 |
| 6,821,397 B2 | 11/2004 | Krassnitzer | |
| 7,084,573 B2 * | 8/2006 | Vukovic et al. | 315/111.41 |
| 2005/0051423 A1 | 3/2005 | Krassnitzer | |
| 2005/0274610 A1* | 12/2005 | Iseki | 204/298.2 |
| 2006/0065525 A1 | 3/2006 | Weichart | |
| 2007/0175748 A1 | 8/2007 | Atamny et al. | |
| 2008/0264783 A1* | 10/2008 | Murphy et al. | 204/298.2 |

FOREIGN PATENT DOCUMENTS

| | | |
|---|---|---|
| WO | 0163643 A1 | 1/2001 |
| WO | 2009095496 A1 | 8/2009 |

* cited by examiner

*Primary Examiner* — Keith Hendricks
*Assistant Examiner* — Timon Wanga
(74) *Attorney, Agent, or Firm* — Pearne & Gordon LLP

(57) ABSTRACT

A magnetron source comprises a target (39) with a sputtering surface and a back surface. A magnet arrangement (30, 32, 19a, 19b) is drivingly moved along the backside of the target (39). A tunnel-shaped magnetron magnetic field is generated between an outer loop (30) and an inner loop (32) of the magnet arrangement. Elongated pivotable or rotatable permanent magnet arrangements (19a, 19b) of the magnet arrangement are provided in an interspace between the outer and inner loops (30, 32) of the overall arrangement.

18 Claims, 6 Drawing Sheets

MAGNETRON SOURCE AND METHOD OF MANUFACTURING

TECHNICAL BACKGROUND

Figure 1:
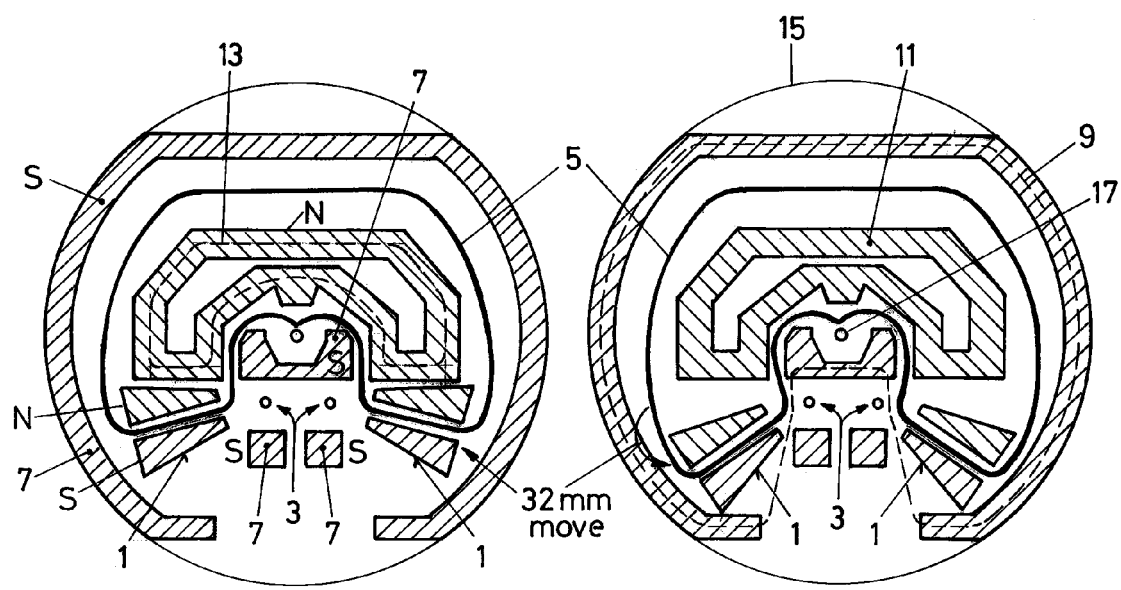

Sputter deposition is a physical vapour deposition (PVD) method of depositing thin films by sputtering material from a "target" onto a "substrate," such as a silicon wafer. The target is thereby exposed to a bombardment with charged particles (ions) that eject atoms and molecules of material from the surface of the target. Magnetron sputter sources utilize strong electric and magnetic fields in the vicinity of the target to trap electrons close to the surface. The magnetic field is usually generated by an arrangement of permanent magnets (more uncommonly solenoids) arranged behind the target, i.e. along the backside or back surface of the target, in such a way that a magnetic tunnel is established above the surface of the target, called the sputtering surface. The electrons are forced to follow helical paths due to the electric and magnetic fields and undergo more ionizing collisions with gaseous neutrals near the target surface than would otherwise occur. This results in a closed loop of intense plasma during operation of the magnetron sputter source. The sputter gas is inert, typically argon. The extra argon ions created as a result of these collisions lead to higher sputter- and deposition rates.

The sputtered particles are predominantly electrically neutral and are therefore unaffected by the magnetic trap. Focusing the impact of electrons by means of the magnetic field tunnel on certain regions of the target results in areas of preferential erosion, the so called "race track." In order to control the erosion and to allow homogeneous deposition results often a relative movement of the magnet system relative to and along the target is established. Rotating magnet systems or linear movements of part of the magnet system are common in the art.

Most of the adjustable magnet designs are based on lateral magnet movement (U.S. Pat. Nos. 5,188,717, 6,821,397 B1).

The design of an adjustable magnet for ferromagnetic materials is much more difficult to realize than for nonmagnetic material. The principal difficulties are:
1. A lot of permanent magnets have to be put into the design to saturate the target; this requires a lot of space.
2. The erosion track has to provide full face erosion; no redeposition zones especially in the target centre are accepted.
3. The "real" erosion prefers magnetic "shortcuts" given by the local saturation of the target material. Detours in the erosion track design are oftentimes disregarded, especially if the magnet set behind the target is not strong enough.
4. Strong motor forces and friction free bearings are required for the magnet movement In U.S. Pat. No. 5,399,253 rotating magnet flipping or pivoting is proposed to achieve full face erosion and high target utilization in an otherwise stationary magnet design. An alternative to lateral magnet movement is given by vertical magnet movement (like in US 2006/0065525A1), however here a dedicated sputter source design is required.

It is an object of the present invention to remedy at least some of the prior art disadvantages as e.g. outlined above.

This is achieved by a magnetron source comprising a target with a sputtering surface and a back surface. Along the back surface there is provided a magnet arrangement of permanent magnets which comprises an outer magnet arrangement arranged along a predominant part of an outer geometric frame shaped or loop shaped locus and having one type magnetic pole facing the back surface as well as an inner magnet arrangement arranged along a predominant part of an inner geometric frame shaped or loop shaped locus within said outer geometric frame shaped or loop shaped locus and having the other type of magnetic pole facing the back surface of the target. The outer and inner geometric loci define an interspace. The outer and inner magnet arrangements generate along the sputtering surface a tunnel shaped magnetron magnetic field along a loop as defined by said inner and outer geometric frame shaped or loop shaped loci. The magnet arrangement is drivingly movable along and relative to the target back surface.

The magnet arrangement thereby comprises at least one elongated permanent magnet arrangement, elongated along an axis which is arranged parallel to, along and distant from the back surface and aligned with the interspace. The elongated arrangement is controllably drivingly pivotable or rotatable about its axis and comprises permanent magnet dipoles radially arranged along and relative to the addressed axis.

In one embodiment of the magnetron source according to the invention, which may be combined with any embodiment of the invention unless being in contradiction, the magnet arrangement is drivingly rotatable about an axis perpendicular to the back surface.

In one embodiment of the magnetron source according to the invention, which may be combined with any embodiment of the invention unless being in contradiction, the elongated arrangement is cylindrical along the axis and the dipoles are preferably realized by permanent magnets along the axis.

In one embodiment of the magnetron source according to the invention, which may be combined with any embodiment of the invention unless being in contradiction, the dipoles are mutually aligned along the axis.

In one embodiment of the magnetron source according to the invention, which may be combined with any embodiment of the invention unless being in contradiction, the magnetron source comprises more than one of the elongated permanent magnet arrangements which are mutually controllably pivotable or rotatable.

In one embodiment of the magnetron source according to the invention, which may be combined with any embodiment of the invention unless being in contradiction, the interspace is symmetrical to a symmetry axis perpendicular to or along the back surface and the elongated arrangements are located aligned with the interspace symmetrically to the symmetry axis.

In one embodiment of the magnetron source according to the invention, which may be combined with any embodiment of the invention unless being in contradiction, the magnetic poles of the inner and outer magnet arrangements distant from and pointing away from said back surface are interconnected across the interspace by a magnetic shunt member, the elongated arrangement being located between said shunt member and said back surface.

In one embodiment of the magnetron source according to the invention, which may be combined with any embodiment of the invention unless being in contradiction, the target is a circular disk, the outer magnet arrangement has a spoke extension towards the center of the circular disk, the outer and inner magnet arrangements thereby generating a magnetron magnetic field also across and bridging over the center.

In one embodiment of the magnetron source according to the invention, which may be combined with any embodiment of the invention unless being in contradiction, the target is of a ferromagnetic material.

The object as addressed above is further achieved by a method of manufacturing a substrate, coated with a layer comprising a material. Such method comprises the steps of generating upon a sputter surface of a target of the addressed material a close loop magnetron magnetic field in an electric field, and moving the magnetron magnetic field along the sputtering surface, thereby sputtering the addressed material off the target and sputter coating a substrate distant from and facing the sputtering surface with a coating material comprising the addressed material. Further and additionally, local wobbling of the magnetron magnetic field with respect to the sputtering surface is performed by means of at least one elongated magnet arrangement, elongated along and drivingly pivotable or rotatable about an axis and having radially extending magnetic dipoles along and with respect to the axis and being mounted with the axis parallel to, along and distant from a back surface of the target in an area in which the magnetic field of the dipoles acts upon the magnetron magnetic field. The elongated magnet arrangement is moved in together with moving of the magnetron magnetic field along the backside and pivoting or rotating the elongated magnet arrangement is performed so as to achieve a desired thickness profile of the coating on the substrate.

In a variant of the method according to the present invention, the addressed material is a ferromagnetic material.

Figure 2:
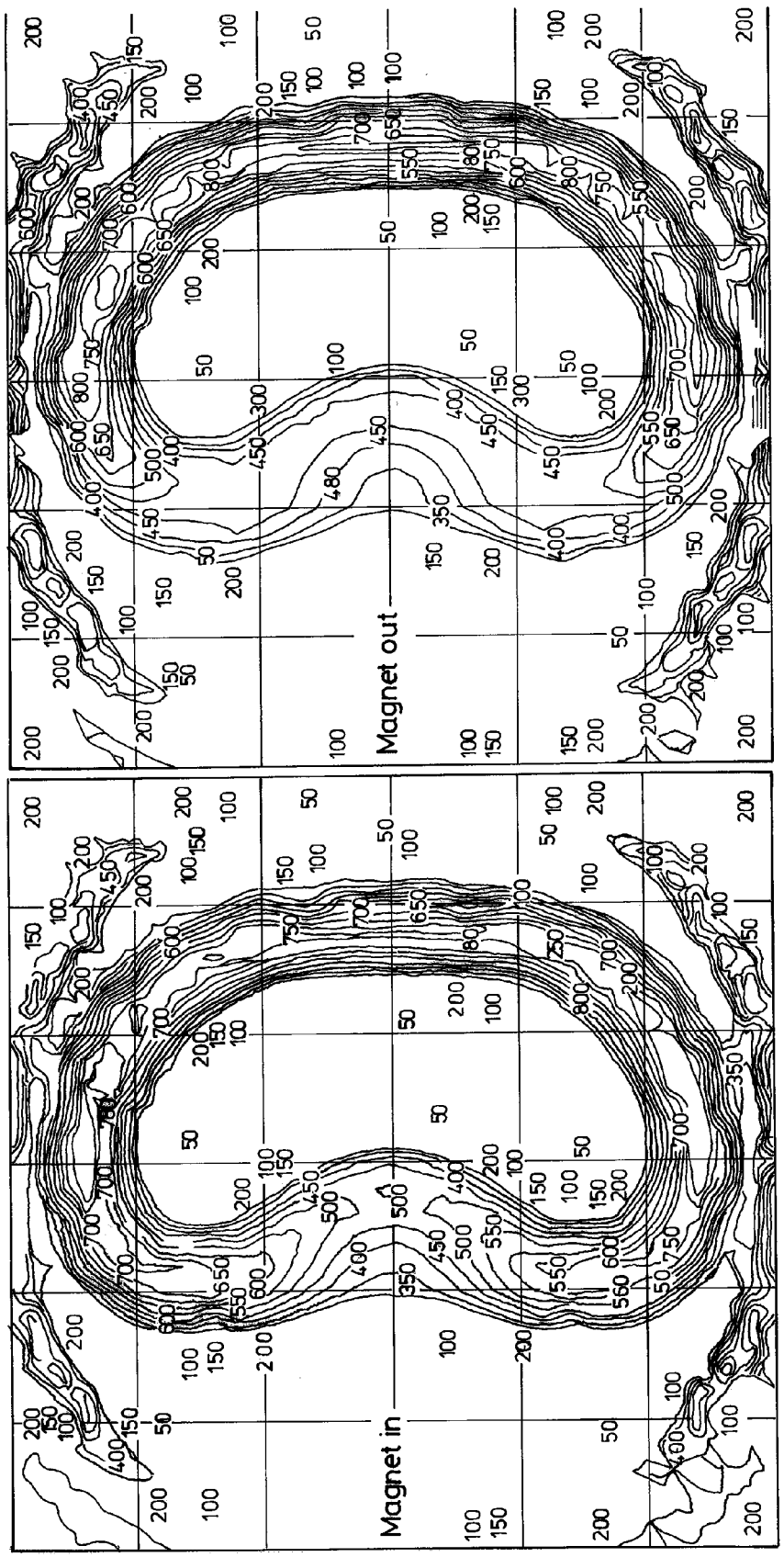
Figure 3:
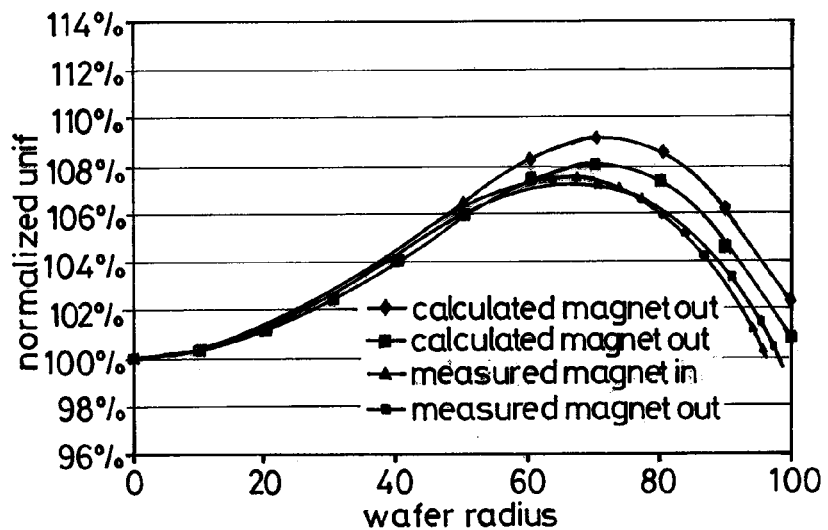
Figure 4:
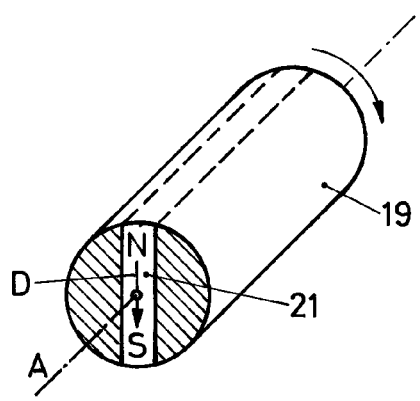
Figure 5:
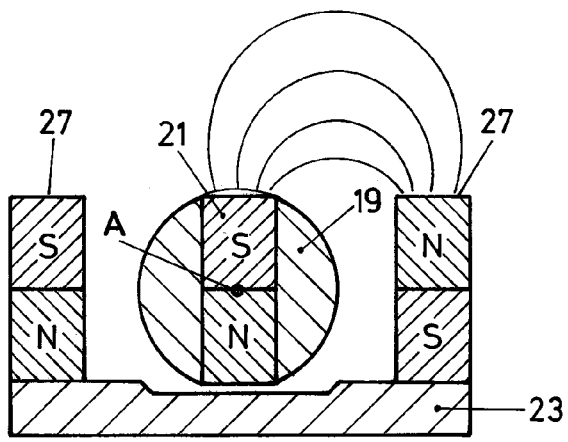
Figure 6:
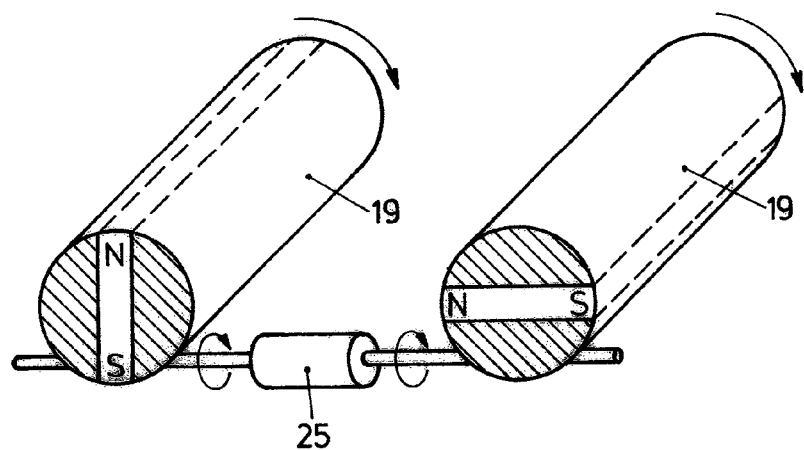
Figure 7:
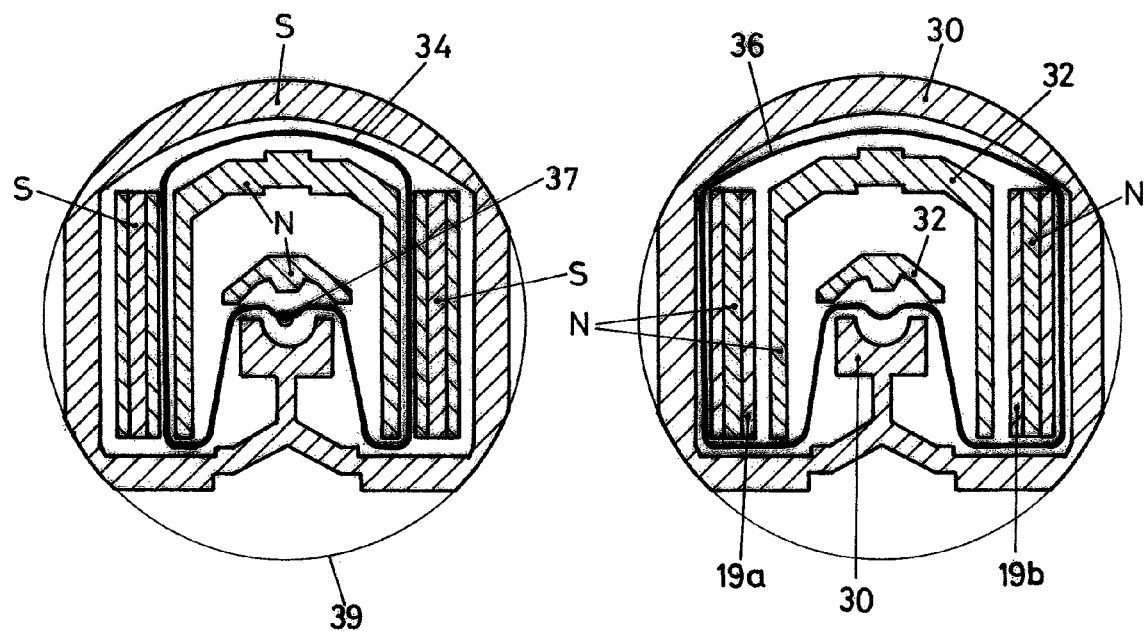
Figure 8:
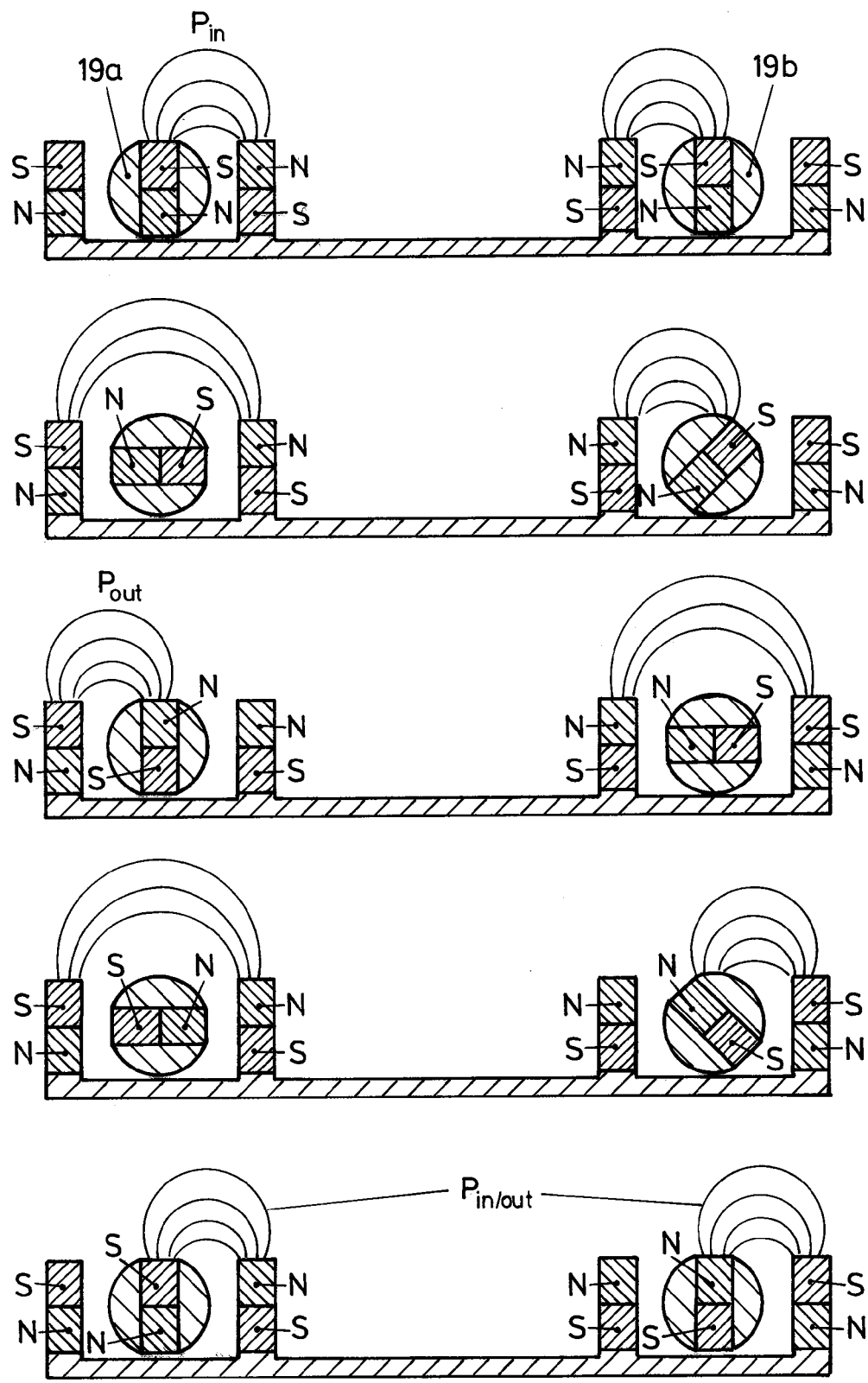
Figure 9:
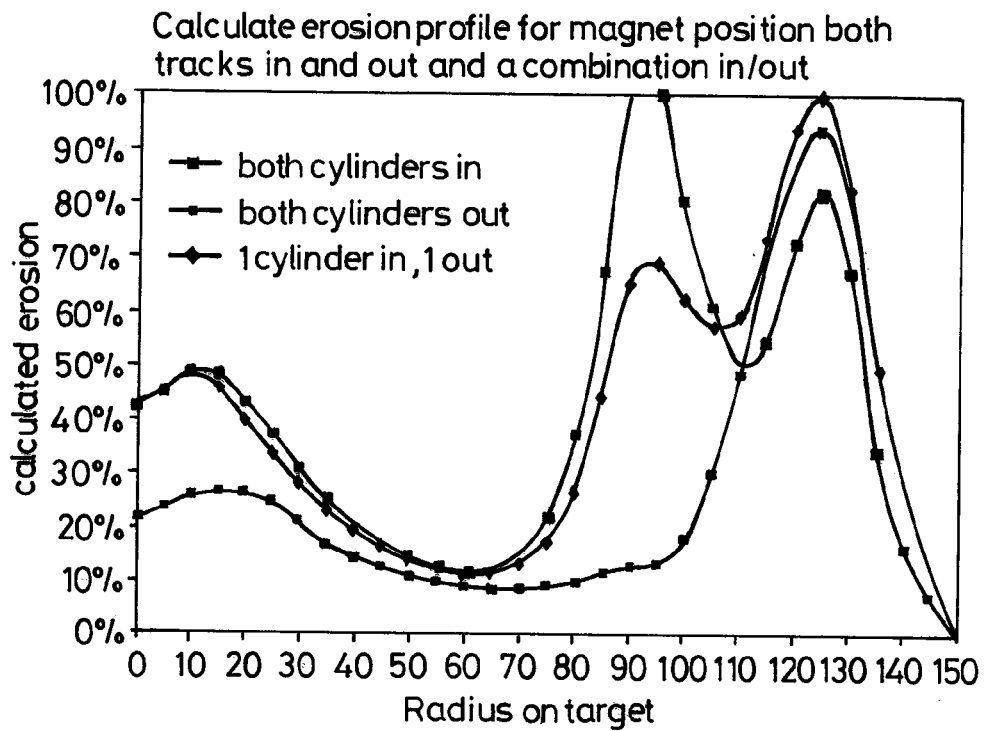
Figure 10:
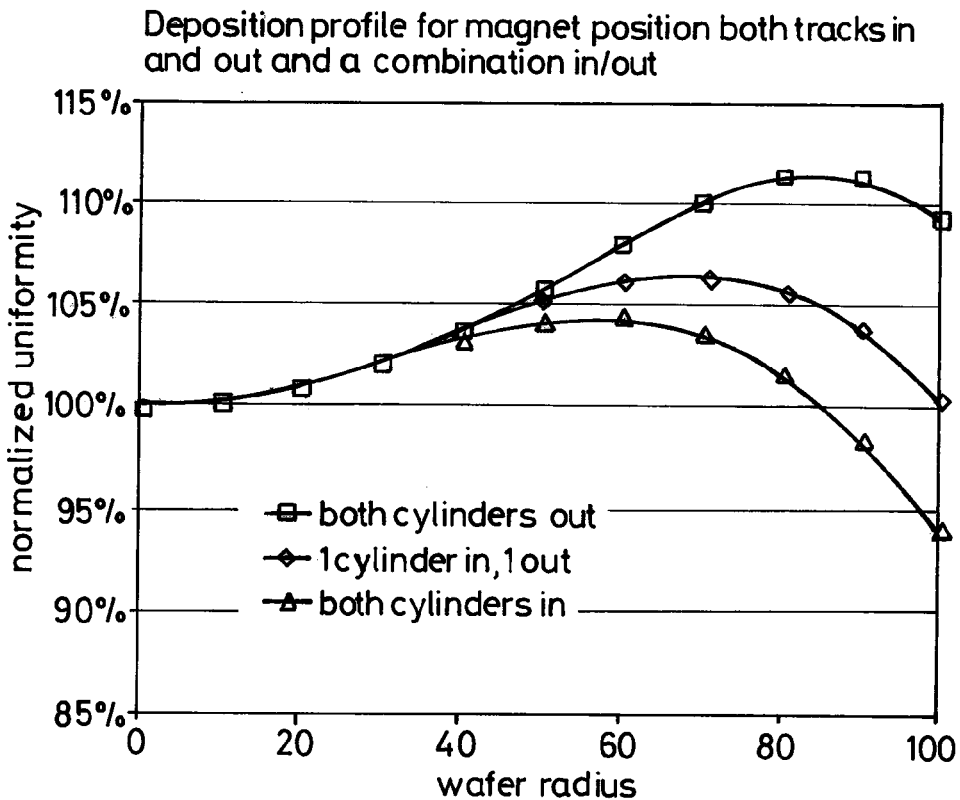

The invention shall now be further exemplified with the help of figures. The figures show:

FIG. 1: Schematically and in a bottom view, a magnetron source with a magnet arrangement comprising a stationary magnet arrangement and adjusting magnets moved relative thereto and according to prior art approach;

FIG. 2: The magnetic field strength in the lateral xy-plane ($B_{xy}$), as a result of simulation by finite element analysis;

FIG. 3: Simulated and measured deposition thickness profile as a result of the approach according to the FIGS. 1 and 2;

FIG. 4: In a perspective representation, a rotating cylinder with permanent magnets, as applied according to an embodiment of the invention;

FIG. 5: A rotating cylinder according to FIG. 4 in the interspace between outer and inner magnet arrangements of a magnetron source according to the present invention with a backing plate bridging and magnetically shunting over the interspace;

FIG. 6: Operatively coupled rotating cylinders as of FIG. 2 and as applied in one embodiment of the magnetron source according to the invention;

FIG. 7: In a schematical bottom view representation, a magnetron source according to the present invention;

FIG. 8: A positioning sequence of two operationally coupled permanent magnet cylinders between outer and inner magnet arrangements in a magnetron source according to the present invention with a backing plate as magnetic shunt and with an angular speed ratio of 2;

FIG. 9: the calculated erosion profiles for the cylinder positions "both out" and "both in" and "one in/one out" in the source as of FIGS. 7 and 8, and FIG. 10: The deposition profiles for the cylinders "both out" and "both in" and "one in/one out" as of FIGS. 7, 8 and 9.

In the following an example is shown demonstrating the difficulties as described above. The design shown in FIG. 1 uses two sets of moving magnets, 1 moved for an angle around the respective turning points 3 to increase the length of the erosion tracks 5 in the outer region of the magnets. The overall magnet arrangement provides for an outer magnet arrangement 7 which is arranged to define an outer geometric loop locus 9 and an inner magnet arrangement 11 which defines an inner geometric loop locus 13. The magnetic pole types which are pointing towards the target 15 are respectively addressed by N and S.

The magnetic field of the source according to FIG. 1 above a 3 mm target 15 with ferromagnetic material with a saturation flux of 2.4 Tesla was simulated by finite element analysis for a given sputter source setup. The lateral field strength in the xy-plane is shown in FIG. 2. Some change in field strength is visible, but the lateral movement of the field is rather small. Thereby the right hand representation of FIG. 2 accords with the position of the moving magnets 1 as shown in the right hand representation of FIG. 1 (magnets out), the left hand representation of FIG. 2 accords with the left hand representation of FIG. 1 (magnets in).

Erosion and deposition profiles were simulated and measured as well, the results of simulation and experiment are plotted in FIG. 3. The example shown above proves that even an extension of 32 mm on the outer erosion track had practically no effect on the uniformity. The measured uniformity variation was even smaller than the simulated. It seems that lateral magnet movement is no viable solution for ferromagnetic materials. In addition to this the lateral magnet movement unbalances the rotation of the overall magnet arrangement 1, 7, 11 about centre 17 shown in FIG. 1.

Nonetheless adjustable magnets are in fact required for fine-tuning the target erosion profile and the deposition profile in a magnetron sputtering setup. For ferromagnetic materials magnetron sputtering relies on a residual field flux above the target after this has been (magnetically) saturated. High forces are involved for magnet movement here.

Basic idea of the present invention is the use of elongated permanent magnet arrangements, especially of cylinders 19 with permanent magnets 21 oriented in the radial direction of the cylinder, i.e. defining magnetic dipoles D along the cylinders 19 oriented radially with respect to the axis A of the cylinders as shown in FIG. 4. These cylinders are installed within assemblies of permanent magnets 27 used for establishing the magnetron magnetic field for magnetron sputtering. The whole setup 27, 19, 23 is typically a section of a rotating magnetron setup with the geometry of a flat disk, where north and south poles are installed along perpendicular dipole-axes with respect to the target back surface on a ferromagnetic backing plate 23 guiding or shunting the magnetic flux and fixating the permanent magnets as shown in FIG. 5.

The cylinder 19 is installed with appropriate bearings to counteract the strong forces between the adjustable and the stationary permanent magnet sets 27 only possibly moved as a part of the overall magnet arrangement along the back surface of the target. A rotation drive is used to rotate the cylinder around the cylinder axis A. By doing so north and south poles can be exchanged by a 180° rotation or intermediate positions (90°) can be used to enhance or attenuate the magnetron magnetic field generated by the stationary permanent magnet set. At least one cylinder 19 has to be used, two or more are possible. Two cylinders 19 can be driven individually or as a system couple by a drive 25 to reduce driving complexity as schematically shown in FIG. 6. Position sensing of the cylinder rotation is possible as an option for initialization and can be realized by a magnet sensor located in the backing plate 23.

FIG. 7 shows a magnetron design rotating about axis 37, with respect to target 39 and with an outer magnet arrangement 30, an inner magnet arrangement 32, and two adjustable magnet cylinders 19a and 19b. The change of the race track (erosion track) is being shown at 34 in comparison to 36.

Thus, FIG. 7 shows a possible design with 2 cylinders on a rotating magnetron. The left figure shows the narrow erosion pattern 34 where both cylinders are flipped with south poles up, on the right figure the north poles are flipped up, giving the outermost erosion track 36.

The case of two coupled cylinders 19a and 19b where the left one is rotating with double angular velocity against the right cylinder is illustrated in sequences in FIG. 8. This design can be realized with a drive 25 as shown in FIG. 6, where the drive axis connecting both cylinders is driving these via threads with pitches having a factor of 2 between them. In FIG. 8 full rotation of the left cylinder 19a is plotted and half rotation of the right one 19b, the sequence can be continued to all possible eight combinations. It has to be noted that some positions may not be useful, in particular when the field of the stationary magnet arrangement 30 and 32 of FIG. 7 which is just rotating about axis 37 is attenuated so that saturation in the target 39 may be too low.

The calculated erosion profiles of the 3 most important cylinder positions "both out", "both in" and "1 in/1 out" are plotted in FIG. 9. Thereby the "both in" position accords for both cylinders with cylinder position $P_{in}$ of FIG. 8, whereas "both out" accords for both cylinders with the position $P_{out}$ in FIG. 8. The position "1 in/1 out" is shown by the two positions of the cylinders $P_{inout}$ in FIG. 8.

It can be clearly seen that there is a huge effect of the adjustable magnets 19 on the erosion profiles. The corresponding deposition profiles are shown in FIG. 10 for a target substrate distance of 60 mm. It can be clearly seen that a remarkable range of variation of about 15% or ±7% is achieved in the uniformity, against less than 1% as described in the prior art example of FIGS. 1 to 3.

Thus a magnetron sputter source is proposed which comprises a target and a magnet system arranged behind the target such that a magnetic magnetron field becomes effective above the sputtering surface of the target. The magnet system exhibits stationary magnets and radially magnetized cylinder(s) as adjustable magnets, arranged essentially in a plane parallel to the target plane such that during operation of a respective magnetron sputter source a closed plasma loop is confined by the magnetic field. The magnet dipole orientation of the cylinders can be rotated or pivoted and thus the shape of the plasma loop is modified or locally wobbled. In a preferred embodiment the magnet arrangement (as a whole) is rotating behind the target back surface in a plane essentially parallel to the target back surface during magnetron sputtering. In a further preferred embodiment magnetic material is being used as target material.

The invention claimed is:

1. A magnetron source comprising a target with a sputtering surface and a back surface, along the back surface a magnet arrangement of permanent magnets, said magnet arrangement comprising an outer magnet arrangement arranged along a predominant part of an outer geometric frame shaped or loop shaped locus and having one type magnetic pole facing said back surface, and an inner magnet arrangement arranged along a predominant part of an inner geometric frame shaped or loop shaped locus within said outer geometric frame shaped or loop shaped locus and having the other type of magnetic pole facing said back surface, said outer and inner geometric loci defining an interspace, said outer and inner magnet arrangements generating along said sputtering surface a tunnel shaped magnetron magnetic field along a loop as defined by said inner and outer geometric loci, said magnet arrangement being drivingly movable along and relative to said back surface of said target, the magnetron source characterized by said magnet arrangement comprising at least one elongated permanent magnet arrangement, elongated centrally along an axis parallel to, along and distant from said back surface and aligned with said interspace, said elongated arrangement being controllably drivingly rotatable about said axis and comprising permanent magnet dipoles radially arranged along and relative to said axis, wherein said elongated arrangement is both cylindrical about said axis parallel to said back surface and rotatable around said axis such that the elongated arrangement is coaxial with said axis, and wherein said magnet arrangement further comprises a second elongated permanent magnet arrangement rotatable about a second axis parallel to, along and distant from said back surface and aligned with said interspace, said elongated arrangement and said second elongated arrangement being respectively rotatable about said axis parallel to said back surface and said second axis parallel to said back surface with different angular velocities, said target being circular and having a center, said outer magnet arrangement having a spoke extension that extends from the outer magnet arrangement towards the center of said circular target in a direction generally parallel to the back surface of the target, said outer and inner magnet arrangements thereby generating said magnetic field also across and bridging over said center.

2. A magnetron source comprising a target with a sputtering surface and a back surface, along the back surface a magnet arrangement of permanent magnets, said magnet arrangement comprising an outer magnet arrangement arranged along a predominant part of an outer geometric frame shaped or loop shaped locus and having one type magnetic pole facing said back surface, and an inner magnet arrangement arranged along a predominant part of an inner geometric frame shaped or loop shaped locus within said outer geometric frame shaped or loop shaped locus and having the other type of magnetic pole facing said back surface, said outer and inner geometric loci defining an interspace, said outer and inner magnet arrangements generating along said sputtering surface a tunnel shaped magnetron magnetic field along a loop as defined by said inner and outer geometric loci, said magnet arrangement being drivingly movable along and relative to said back surface of said target, the magnetron source characterized by said magnet arrangement comprising at least one elongated permanent magnet arrangement, elongated centrally along an axis parallel to, along and distant from said back surface and aligned with said interspace, said elongated arrangement being controllably drivingly rotatable about said axis and comprising permanent magnet dipoles radially arranged along and relative to said axis, wherein said elongated arrangement is both cylindrical about said axis parallel to said back surface and rotatable around said axis such that the elongated arrangement is coaxial with said axis, said target being circular and having a center, said outer magnet arrangement having a spoke extension that extends from the outer magnet arrangement towards the center of said circular target in a direction generally parallel to the back surface of the target, said outer and inner magnet arrangements thereby generating said magnetic field also across and bridging over said center.

3. The magnetron source of claim 2, said dipoles of said elongated permanent magnet arrangement being aligned along said axis parallel to said back surface.

4. The magnetron source of claim 1, wherein said elongated arrangement and said second elongated arrangement are mutually controllably pivotable or rotatable.

5. The magnetron source of claim 4, said interspace being symmetrical to a symmetry axis perpendicular to or along said back surface and said elongated arrangements being located aligned with said interspace symmetrically to said symmetry axis.

6. The magnetron source of claim 2, said magnetic poles of said outer and inner magnet arrangements distant from and pointing away from said back surface being interconnected across said interspace by a magnetic shunt member, said elongated arrangement being located between said shunt member and said back surface.

7. The magnetron source of claim 2, wherein said magnet arrangement is drivingly rotatable about an axis perpendicular to said back surface.

8. The magnetron source of claim 1, said target being of ferromagnetic material.

9. The magnetron source of claim 2, said target being of ferromagnetic material.

10. The magnetron source of claim 2, wherein said dipoles of said elongated permanent magnet arrangement are realized by permanent magnets along said axis parallel to said back surface.

11. The magnetron source of claim 10, said dipoles of said elongated permanent magnet arrangement being aligned along said axis parallel to said back surface.

12. The magnetron source of claim 2, wherein the elongated permanent magnet arrangement is rotatable separately from both of the inner and outer magnet arrangements.

13. The magnetron source of claim 2, wherein said elongated arrangement is rotatable within the interspace around said axis by at least 180°.

14. The magnetron source of claim 13, wherein said elongated arrangement is rotatable about said axis such that either the north pole or south pole of at least one of the permanent magnet dipoles can face the back surface of the target.

15. The magnetron source of claim 1, wherein said elongated arrangement and said second elongated arrangement are coupled such that they rotate simultaneously.

16. The magnetron source of claim 1, wherein said elongated arrangement and said second elongated arrangement are individually drivingly rotatable.

17. The magnetron source of claim 2, wherein said elongated arrangement and said axis are located in the interspace.

18. The magnetron source of claim 2, wherein the spoke extension extends from the outer magnet arrangement towards the center of said circular target in a direction generally parallel to said axis parallel to the back surface.

* * * * *